United States Patent
Igarashi et al.

(10) Patent No.: US 9,274,254 B2
(45) Date of Patent: Mar. 1, 2016

(54) OPTICAL ELEMENT ARRAY, PHOTOELECTRIC CONVERSION APPARATUS, AND IMAGE PICKUP SYSTEM

(71) Applicant: CANON KABUSHIKI KAISHA, Tokyo (JP)

(72) Inventors: Kazuya Igarashi, Kawasaki (JP); Kazunari Kawabata, Kawasaki (JP); Jun Iba, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 14/508,839

(22) Filed: Oct. 7, 2014

(65) Prior Publication Data

US 2015/0097996 A1    Apr. 9, 2015

(30) Foreign Application Priority Data

Oct. 9, 2013    (JP) ................. 2013-212298

(51) Int. Cl.
    *H04N 5/369*    (2011.01)
    *G02B 3/00*     (2006.01)
    *H01L 27/146*   (2006.01)

(52) U.S. Cl.
    CPC ........ *G02B 3/0037* (2013.01); *H01L 27/14627* (2013.01); *H01L 27/14643* (2013.01); *H04N 5/369* (2013.01)

(58) Field of Classification Search
    CPC ............ G02B 3/0037; H01L 27/14627; H01L 27/14643; H04N 5/369
    See application file for complete search history.

(56) References Cited

U.S. PATENT DOCUMENTS

| 2006/0027825 A1 | 2/2006 | Kuriyama |
| 2007/0181923 A1 | 8/2007 | Tanaka |
| 2008/0011936 A1 | 1/2008 | Kuo et al. |

FOREIGN PATENT DOCUMENTS

| CN | 1731586 A | 2/2006 | |
| CN | 101013713 A | 8/2007 | |
| JP | H08-116041 A | 5/1996 | |
| JP | H11-150254 A | 6/1999 | |
| JP | 2004-347693 A | 12/2004 | |
| JP | 2004347693 | * 12/2004 | .............. G02B 3/00 |
| JP | 2006-049721 A | 2/2006 | |
| JP | 2010-245202 A | 10/2010 | |
| JP | 2013-044970 A | 3/2013 | |

* cited by examiner

*Primary Examiner* — Christopher K Peterson
(74) *Attorney, Agent, or Firm* — Canon USA Inc., IP Division

(57) ABSTRACT

An optical element array includes a first optical element and a second optical element that is further away from a center of an array region than the first optical element. Orthogonal projections of the first and second optical elements include first and second ends and third and fourth ends, respectively, and vertices thereof are at first and second positions. An interval between the third end and the second position is smaller than that between the first end and the first position and that between the fourth end and that second position. The first and second optical elements respectively include first and second outer edges extending from the vertices thereof to the second and fourth ends. A radius of curvature, or a median value of the radius of curvature, of the second outer edge is in the range of 80% to 120% of that of the first outer edge.

20 Claims, 9 Drawing Sheets

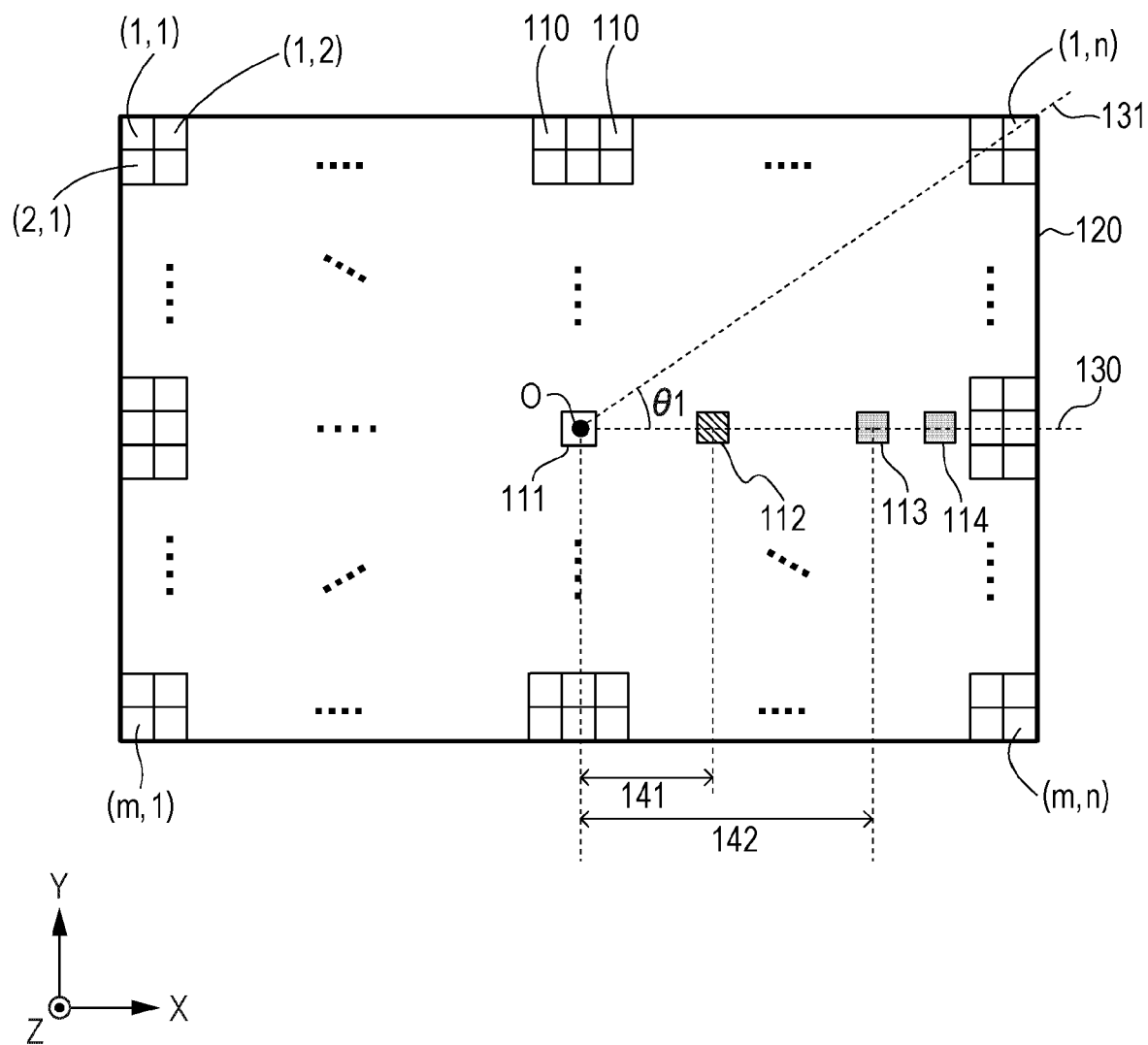

FIG. 5
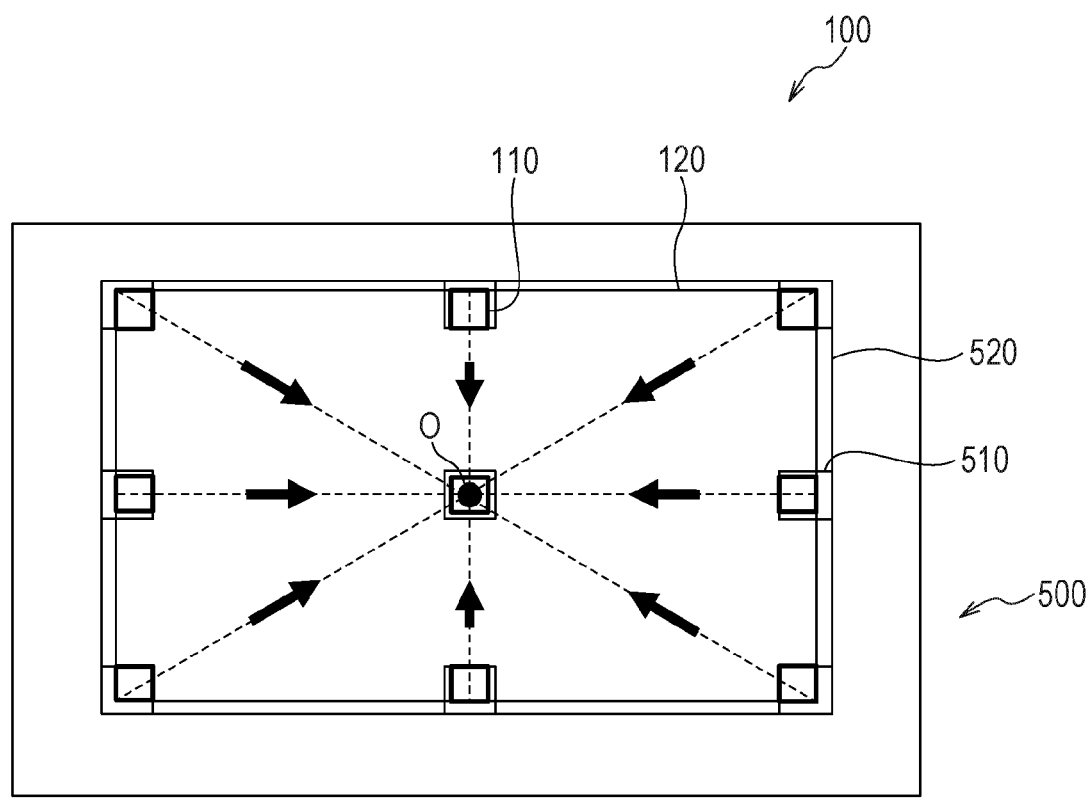
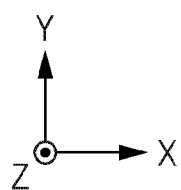

OPTICAL ELEMENT ARRAY, PHOTOELECTRIC CONVERSION APPARATUS, AND IMAGE PICKUP SYSTEM

BACKGROUND OF THE INVENTION

1. Field of the Invention

The present invention relates to an optical element array, a photoelectric conversion apparatus including the optical element array, and an image pickup system.

2. Description of the Related Art

Photoelectric conversion apparatuses include optical element arrays, such as microlens arrays. Japanese Patent Laid-Open No. 2006-049721 discloses a photoelectric conversion apparatus in which the maximum curvature of convex surfaces of microlenses in an outer (peripheral) region of the photoelectric conversion apparatus is greater than that of convex surfaces of microlenses in a central region of the photoelectric conversion apparatus, so that light that is obliquely incident on the photoelectric conversion apparatus can be efficiently collected.

SUMMARY OF THE INVENTION

An optical element array includes a plurality of optical elements including at least a first optical element and a second optical element located on a same plane. The first optical element is located at a center of an array region, which is a region on the same plane in which the optical elements are arranged. The second optical element is further from the center of the array region than the first optical element. An orthogonal projection of the first optical element on the plane includes a first end and a second end located closer to the second optical element than the first end and located on a first straight line that passes through the first end and the center of the array region. An orthogonal projection of a vertex of the first optical element on the plane is equally spaced from the first end and the second end and located at a first position on the first straight line. An orthogonal projection of the second optical element on the plane includes a third end that is located on the first straight line and a fourth end that is located on the first straight line and that is further from the center of the array region than the third end is. An orthogonal projection of a vertex of the second optical element on the plane is located at a second position on the first straight line. An interval between the third end and the second position is smaller than an interval between the first end and the first position, and is also smaller than an interval between the fourth end and the second position. In a cross section of the first optical element, the cross section being perpendicular to the plane and including the first straight line, the first optical element includes a first outer edge that extends from the vertex of the first optical element to the second end. In a cross section of the second optical element, the cross section being perpendicular to the plane and including the first straight line, the second optical element includes a second outer edge that extends from the vertex of the second optical element to the fourth end. A radius of curvature of the second outer edge or a median value of the radius of curvature of the second outer edge is greater than or equal to 80% and less than or equal to 120% of a radius of curvature of the first outer edge.

An optical element array includes a plurality of optical elements including at least a first optical element and a second optical element located on a same plane. The second optical element is further from a center of an array region, which is a region on the same plane in which the optical elements are arranged, than the first optical element. An orthogonal projection of the first optical element on the plane includes a first end and a second end located further from the center of the array region than the first end is and located on a first straight line that passes through the first end and the center of the array region. An orthogonal projection of a vertex of the first optical element on the plane is located at a first position on the first straight line. An orthogonal projection of the second optical element on the plane includes a third end that is located on the first straight line and a fourth end that is located on the first straight line and that is further from the center of the array region than the third end is. An orthogonal projection of a vertex of the second optical element on the plane is located at a second position on the first straight line. An interval between the third end and the second position is smaller than an interval between the first end and the first position, and is also smaller than an interval between the fourth end and the second position. In a cross section of the first optical element, the cross section being perpendicular to the plane and including the first straight line, the first optical element includes a first outer edge that extends from the vertex of the first optical element to the second end. In a cross section of the second optical element, the cross section being perpendicular to the plane and including the first straight line, the second optical element includes a second outer edge that extends from the vertex of the second optical element to the fourth end. A radius of curvature of the second outer edge or a median value of the radius of curvature of the second outer edge is greater than or equal to 80% and less than or equal to 120% of a radius of curvature of the first outer edge or greater than or equal to 80% and less than or equal to 120% of a median value of the radius of curvature of the first outer edge.

Further features of the present invention will become apparent from the following description of exemplary embodiments with reference to the attached drawings.

BRIEF DESCRIPTION OF THE DRAWINGS

FIG. 1 is a schematic plan view for describing a first embodiment.

FIG. 5 is a schematic plan view for describing the second embodiment.

DESCRIPTION OF THE EMBODIMENTS

Figure 2A:
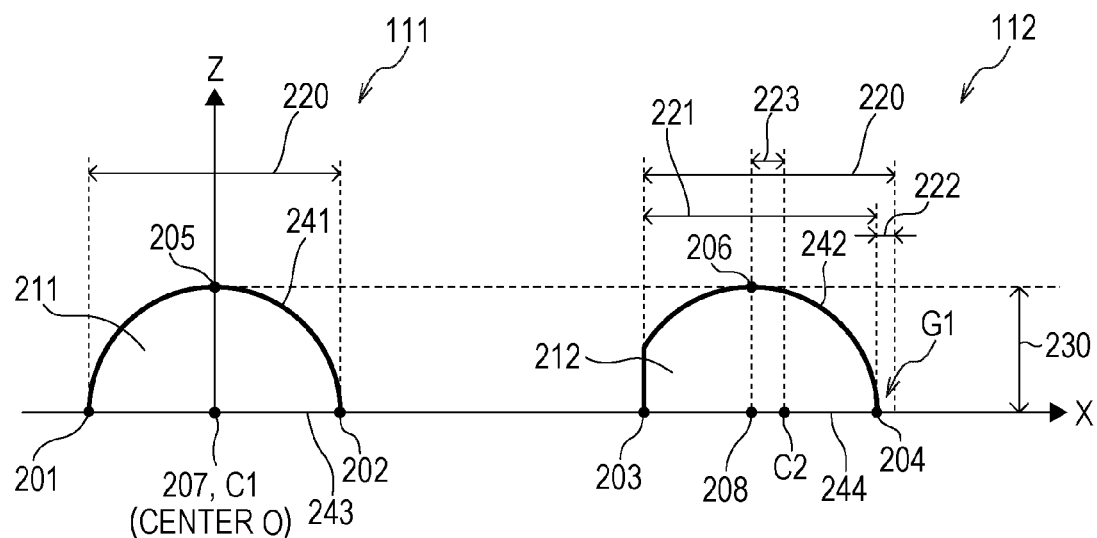
FIG. 2A is a diagram for describing the shape of an optical element array according to the first embodiment.

With the microlenses described in Japanese Patent Laid-Open No. 2006-049721, although the maximum curvature of the convex surfaces of the microlenses is taken into consideration, the curvatures of end portions of the microlenses are not taken into consideration. The relationship between the curvatures of the end portions of the microlenses and the positions of the microlenses is also not taken into consideration.

When end portions of optical elements have different curvatures depending on the positions of the optical elements in an array region of the optical element array, there is a possibility that the light collecting performance of the optical elements will be reduced at the periphery of the array region. The reduction in the light collecting performance of the optical elements at the periphery of the array region may cause shading of an image in a photoelectric conversion apparatus.

Accordingly, the present disclosure provides an optical element array with which the reduction in light collecting performance of optical elements at the periphery of the array region can be suppressed.

The structures of optical element arrays according to embodiments of the present disclosure will be described. The embodiments may be modified or combined as appropriate. Optical element arrays according to the present disclosure may be included in a photoelectric conversion apparatus, a display device, an image pickup system including the photoelectric conversion apparatus, or a display system including the display device.

In the following description, an X-axis direction (first direction), a Y-axis direction (second direction), and a Z-axis direction (third direction), which pass through a certain center O, are used as references. However, the references are not limited to this. For example, a direction 131 that is inclined by an angle θ1 with respect to the X-axis direction illustrated in FIG. 1 may be defined as the first direction, and a direction perpendicular to the direction 131 may be defined as the second direction. In other words, any direction that radially extends from the center of a region in which optical elements are arranged (array region) toward the outer periphery of the region may be defined as the first direction, and a direction perpendicular to the first direction may be defined as the second direction. In the following description, it is assumed that the optical element array extends along a plane including the first direction and the second direction.

First Embodiment

An optical element array according to a first embodiment will be described with reference to FIGS. 1, 2A, and 2B. FIG. 1 is a schematic plan view illustrating an optical element array 100. The schematic plan view shows a projection image (orthogonal projection image) in which each element is projected onto a plane including an X-axis and a Y-axis, which is perpendicular to the X-axis.

The optical element array 100 includes a plurality of optical elements 110 on the same plane. The optical elements 110 are arranged in an array region 120. An orthogonal projection of the array region 120 has a center (hereinafter referred to as center O). The center O of the array region 120 is the center of a region in which the optical elements 110, which function optically, are arranged in at least one direction. Here, optical elements that do not function optically include, for example, optical elements arranged in a light shielding region including an optical black region, a peripheral circuit region, etc., of a photoelectric conversion apparatus. The optical elements 110 are arranged such that the centers of orthogonal projection images of the optical elements 110 are on a straight line that extends in a single direction.

In the present embodiment, the optical elements 110 are arranged on a plane including an X-axis and a Y-axis, which is perpendicular to the X-axis. More specifically, the optical elements 110 are arranged in a matrix pattern (two-dimensional pattern) including n columns (n is a natural number) that are arranged in a direction along the X-axis (hereinafter referred to as an X-axis direction) and m rows (m is a natural number) that are arranged in a direction along the Y-axis (hereinafter referred to as a Y-axis direction). The one direction is defined as the X-axis direction (straight line). In FIG. 1, the coordinates of each optical element 110 are defined as (m, n). In the following description, an optical element 111 (first optical element) and an optical element 112 (second optical element) will be described as examples. As illustrated in FIG. 1, in the present embodiment, the optical element 111 is at the center O of the array region 120, and the optical element 112 is separated from the optical element 111 by a length 141 in the X-axis direction. Here, it is assumed that the bottom surfaces of the optical elements 110 are included in the above-described plane.

FIG. 2A is a schematic diagram for describing the cross-sectional shapes of the optical element 111 and the optical element 112 along a plane that extends in the X-axis direction and a direction along a Z-axis (hereinafter referred to as a Z-axis direction). The Z-axis is perpendicular to both the X-axis and the Y-axis. In the following description, dimensions of each optical element in the X-axis direction, the Y-axis direction, and the Z-axis direction are defined as length, width, and height, respectively. The shapes of the optical element 111 and the optical element 112 will now be described in detail. In drawings illustrating cross-sectional shapes of optical elements, such as FIG. 2A, the cross-sectional shapes may be referred to as cross sections.

The optical element 111 has a semispherical shape, and has a vertex on the Z-axis in the plane extending in the X-axis direction and the Z-axis direction. Referring to FIG. 2A, in a cross section 211 of the optical element 111, the optical element 111 includes a first end 201 and a second end 202 that are arranged in the first direction. Each end may either be a dot or a line. In the following description, the ends are dots arranged in the first direction (straight line). As shown in the cross section 211, the optical element 111 has a bottom surface 243 that extends along the X-axis at the position where Z=0. The first end 201 of the optical element 111 is separated from the center O in the direction opposite to the X-axis direction, and the second end 202 of the optical element 111 is separated from the center O in the X-axis direction. The length between the first end 201 and the second end 202 in the X-axis direction is a length 220. The length between the first end 201 and the second end 202 may be the largest length of the optical element 111 in the X-axis direction. Here, a length between two positions may mean an interval or a distance.

As illustrated in FIG. 2A, the optical element 111 has a first vertex 205 that is located at a first position 207 in the X-axis direction in the orthogonal projection image. The optical element 111 has a rotationally symmetrical shape with respect to the normal to the bottom surface 243 that passes through the vertex 205. Here, the vertex is a highest portion of the optical element. The optical element may have a flat top surface. In such a case, the height of any point on the flat surface is defined as the height of the vertex. Also in the following description, the vertex has the same meaning. The first vertex 205 is located at a position separated from the bottom surface 243 by a length 230 in the Z-axis direction. In other words, the height of the optical element 111 is the length 230. In addition, in the orthogonal projection image, the length between the first position 207 and the first end 201 is equal to the length between the first position 207 and the second end 202. When it is assumed that the optical element 111 is provided in a unit cell that is a rectangular region having the length 220, it can be said that the first vertex 205 is at a center C1 of the unit cell. In the present embodiment, the first position 207 is located at the center O of the array region 120 in FIG. 1.

The optical element 112 has an aspherical shape. When a cross section 212 is set as a reference, the optical element 112 is symmetric (line symmetric). However, the optical element 112 does not have a rotationally symmetrical shape with respect to the normal to a bottom surface 244 that passes through a second vertex 206. The optical element 112 may, for example, have a planar shape illustrated in FIGS. 8A to 8C, which will be described below, or a shape called a teardrop shape.

Referring to FIG. 2A, the cross section 212 of the optical element 112 includes a third end 203 and a fourth end 204. As shown in the cross section 212, the optical element 112 has the bottom surface 244 that extends along the X-axis at the position where Z=0. The third end 203 of the optical element 112 is closer to the center O, and the fourth end 204 of the optical element 112 is further from the center O. The length between the third end 203 and the fourth end 204 in the X-axis direction is a length 221. The length between the third end 203 and the fourth end 204 may be the largest length of the optical element 112 in the X-axis direction.

As illustrated in FIG. 2A, the optical element 112 has the second vertex 206 that is located at a second position 208 in the X-axis direction. The second vertex 206 is at a position separated from the bottom surface 244 by the length 230 in the Z-axis direction. In other words, the height of the optical element 112 is the length 230, which is the same as the height of the optical element 111. In the orthogonal projection image, the length between the second position 208 and the third end 203 is smaller than the length between the second position 208 and the fourth end 204. When it is assumed that the optical element 112 is provided in a unit cell that is a rectangular region having the length 220, it can be said that the second vertex 206 is closer to the center O than a center C2 of the unit cell by a length 223.

When the optical element 111 and the optical element 112 are compared with each other, in the X-axis direction, the length between the first end 201 and the first position 207 is greater than the length between the third end 203 and the second position 208. In other words, unlike the positional relationship between the first vertex 205 and the center of the optical element 111, the second vertex 206 is shifted toward the center O from the center of the optical element 112. In addition, the length 221, which is the length between the third end 203 and the fourth end 204, is smaller than the length 220, which is the length between the first end 201 and the second end 202, by a length 222.

Each of the optical element 111 and the optical element 112 has a plurality of outer edges which will be described below. The optical element 111 has an outer edge 241 (first outer edge) that extends from the first vertex 205 to the second end 202. Similarly, the optical element 112 has an outer edge 242 (second outer edge) that extends from the second vertex 206 to the fourth end 204. The radius of curvature of the outer edge 242 is the same as the radius of curvature of the outer edge 241. When the optical elements have such a shape, in the case where the vertices of the optical elements are shifted, reduction in the light collecting performance of the optical elements can be suppressed even at positions separated from the center O in the X-axis direction. In the case where the outer edge 241 and/or the outer edge 242 have/has a nonuniform radius of curvature, the median value of the radius of curvature of the outer edge 241 and/or the median value of the radius of curvature of the outer edge 242 may be determined. The effects of the present embodiment can be achieved as long as the radii of curvature, or the median values of the radii of curvature, are in the range of 80% or more and 120% or less. In other words, the effects can be achieved as long as the difference between the radii of curvature, or the median values of the radii of curvature, is within ±20%.

Next, a case in which the optical element array according to the present embodiment is included in a photoelectric conversion apparatus will be described with reference to FIG. 2B. FIG. 2B is a schematic sectional view of a part of a photoelectric conversion apparatus including the optical element array corresponding to FIG. 2A. A multilayer wiring structure 252 including a plurality of wiring layers and a plurality of insulating layers, a color filter layer 253 including a plurality of color filters, and a planarization layer 254 are provided on a semiconductor substrate 250 including a plurality of photoelectric conversion elements 251. The optical element array 100 is provided on the planarization layer 254. The semiconductor substrate is, for example, an N-type semiconductor substrate, and includes an epitaxial layer and P-type semiconductor regions that serve as wells. The photoelectric conversion elements are, for example, photodiodes. In FIG. 2B, N-type semiconductor regions that serve as the photoelectric conversion elements are illustrated. Here, pixels are rectangular regions, and are also regarded as unit cells. Each pixel includes at least one photoelectric conversion element. In the present embodiment, a single pixel is provided for each of the optical elements included in the optical element array 100. In other words, the optical element array 100 is arranged in accordance with an image pickup region, in which a plurality of pixels of the photoelectric conversion apparatus are arranged. Here, the image pickup region is a region in which the pixels for acquiring image signals are arranged, and the center of the image pickup region is the center of the region in which the pixels for acquiring optical signals are arranged. The region in which the pixels for acquiring the optical signals are arranged does not include optical black pixels or circuit regions. FIG. 2B illustrates three optical elements 111 and three optical elements 112. Three photoelectric conversion elements (first photoelectric conversion elements) are provided for the three optical elements 111, and three photoelectric conversion elements (second photoelectric conversion elements) are provided for the three optical elements 112. The three optical elements 111 are arranged without gaps therebetween, and are in contact with each other. Here, gaps refer to flat regions between the optical elements. The three optical elements 112 are arranged with gaps G1 therebetween. The behavior of light in the above-described photoelectric conversion apparatus will now be described.

In general, an imaging lens (not shown) is disposed above the image pickup region of the photoelectric conversion apparatus. The imaging lens is arranged such that an optical axis thereof corresponds to the center of the image pickup region, and focuses light from an object on the plane of the image pickup region. At this time, the incident angle of the chief ray is small at the center of the image pickup region, and the incident angle of the chief ray is large at the periphery of the image pickup region. Here, the incident angle is, for example, an angle between a direction perpendicular to the top surface of the photoelectric conversion apparatus and the chief ray. To increase the sensitivity at the periphery of the image pickup region, it is necessary to collect the incident light and make the direction in which light is incident on the light receiving surface of each photoelectric conversion element of the photoelectric conversion apparatus close to the direction perpendicular to the light receiving surface.

Figure 2B:
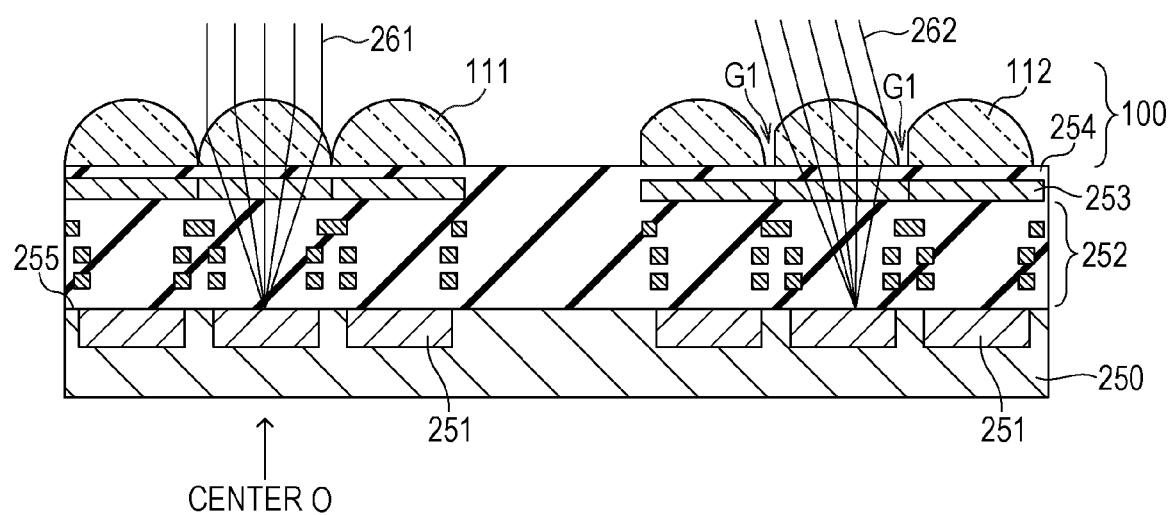
FIG. 2B is a schematic sectional view for describing the first embodiment.

Referring to FIG. 2B, light 261 is a chief ray that is incident on the optical element array 100 at the center of the image pickup region, which is also the center of the optical element array 100, and is incident on a surface 255 of the semiconductor substrate 250 in a direction substantially perpendicular to the surface 255. Light 262 is a chief ray that is incident on the optical element array 100 at a position separated from the center of the image pickup region, that is, from the center of the optical element array 100, and is obliquely incident on the surface 255 of the semiconductor substrate 250. Each optical element 112 is capable of reducing the incident angle at which the light 262 is incident on the light receiving surface of the corresponding photoelectric conversion element. In addition, high light collecting performance can be achieved even at the periphery of the image pickup region. As a result, the sensitivity can be increased at the periphery of the image pickup region.

Figure 3A:
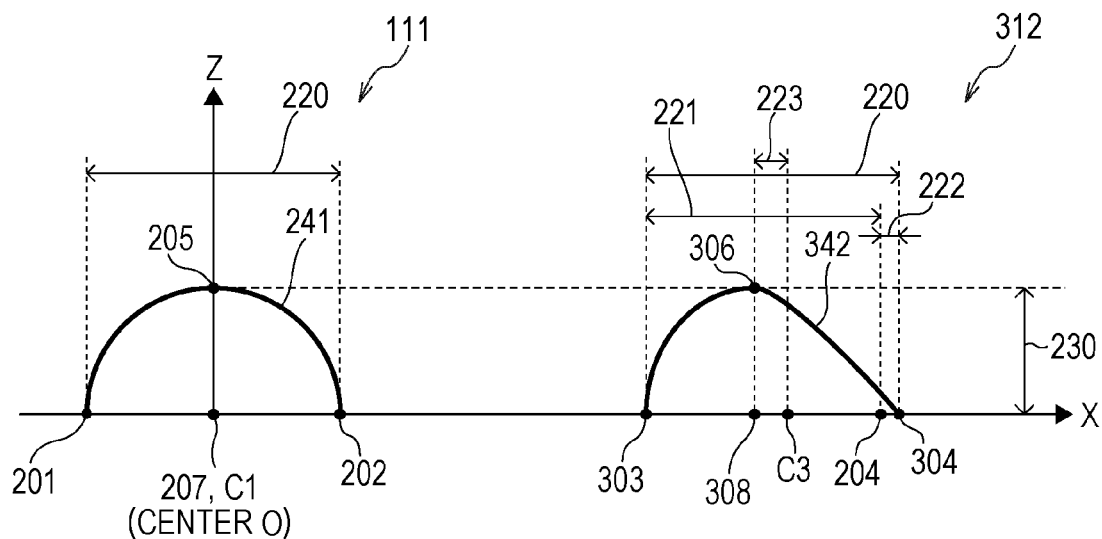
FIG. 3A is a diagram for describing the shape of an optical element array according to the first embodiment.
Figure 3B:
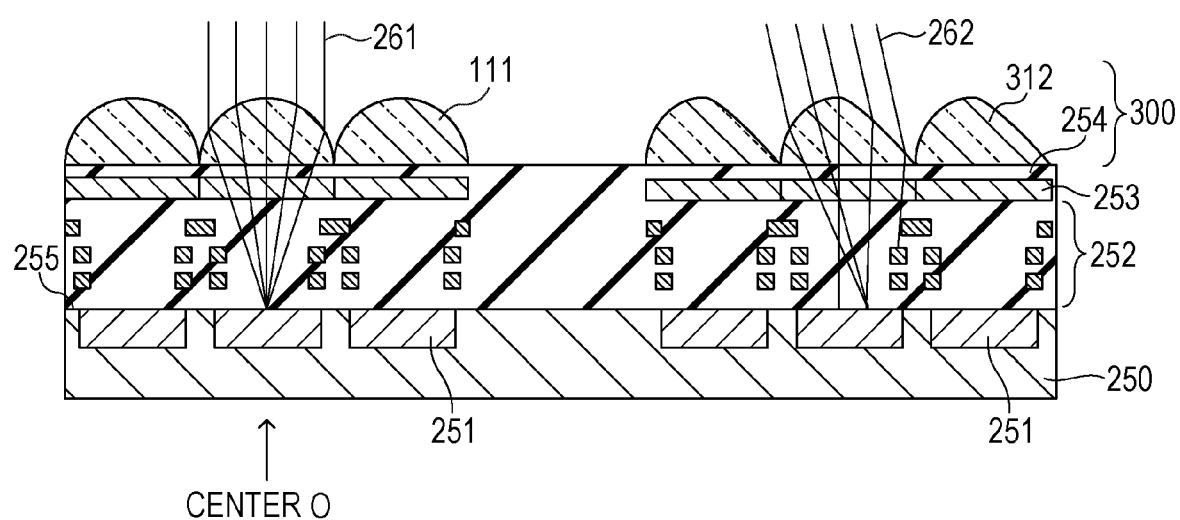
FIG. 3B is a schematic sectional view for describing the first embodiment.

Next, the effects achieved by the optical elements according to the present embodiment will be described with reference to FIGS. 3A and 3B. FIGS. 3A and 3B illustrate a case in which an optical element array 300 including optical elements 312 having a shape that differs from the shape of the optical elements in FIGS. 2A and 2B is used. FIG. 3A is a schematic diagram corresponding to FIG. 2A, and illustrates the cross sectional shapes of each optical element 111 and each optical element 312. FIG. 3B is a schematic sectional view corresponding to FIG. 2B, and illustrates a photoelectric conversion apparatus including the optical elements 111 and the optical elements 312. In the structure illustrated in FIGS. 3A and 3B, the optical elements 111 are the same as the optical elements 111 illustrated in FIGS. 2A and 2B, and explanations thereof are thus omitted.

The cross section of the optical element 312 illustrated in FIG. 3A includes an end 303 of the optical element 312 that is closer to the center O, and an end 304 of the optical element 312 that is further from the center O of the optical element 312, and is taken along the X-axis. As illustrated in the cross section, the optical element 312 has a bottom surface that extends along the X-axis at the position where Z=0. The end 303 of the optical element 312 is closer to the center O, and the end 304 of the optical element 312 is further from the center O. The length between the end 303 and the end 304 in the X-axis direction is the length 220. The length between the end 303 and the end 304 is the largest length of the optical element 312 in the X-axis direction.

Referring to FIG. 3A, the optical element 312 has a vertex 306 at a position 308 in the X-axis direction. The vertex 306 is at a position separated from the bottom surface by the length 230 in the Z-axis direction. In other words, the height of the optical element 312 is the length 230, which is the same as the height of the optical element 111. The length between the position 308 and the end 303 is smaller than the length between the position 308 and the end 304. When it is assumed that the optical element 312 is provided in a unit cell that is a rectangular region having the length 220, it can be said that the vertex 306 is closer to the center O than a center C3 of the unit cell by a length 223.

Similar to the optical element 111, the cross section of the optical element 312 illustrated in FIG. 3A has an outer edge 342 that extends from the vertex 306 to the end 304. The differences between the optical element 312 and the optical element 112 illustrated in FIGS. 2A and 2B are the length in the X-axis direction and the radius of curvature of the outer edge. The radius of curvature of the outer edge 342 differs from that of the outer edge 242 of the optical element 112 illustrated in FIGS. 2A and 2B. In other words, the radius of curvature of the outer edge 342 differs from that of the outer edge 241 of the optical element 111. The radius of curvature, or the median value of the radius of curvature, of the outer edge 342 is not in the range of 80% or more and 120% or less (i.e. greater than or equal to 80% and less than or equal to 120%) of the radius of curvature, or the median value of the radius of curvature, of the outer edge 241. More specifically, the radius of curvature of the outer edge 342 is above the range of 80% or more and 120% or less (i.e. greater than or equal to 80% and less than or equal to 120%) of the radius of curvature of the outer edge 241.

FIG. 3B illustrates a case in which light 262 is incident in a manner similar to that in FIG. 2B on a photoelectric conversion apparatus including optical elements 312 having the above-described structure. The light collecting performance of the optical elements 312 is smaller than that of the optical elements 112 illustrated in FIG. 2B, and the light 262 is incident on a wiring layer instead of the corresponding photoelectric conversion elements 251.

The radius of curvature of the optical elements 112 illustrated in FIG. 2B is the same as that of the optical elements 111. With this type of optical element array, the reduction in light collecting performance of the optical elements at the periphery of the array region can be suppressed. In the photoelectric conversion apparatus including the optical element array, the reduction in sensitivity at the periphery of the image pickup region can be suppressed.

The optical element array according to the present embodiment can be formed by the following method. For example, the color filter layer 253 is formed on the multilayer wiring structure of the photoelectric conversion apparatus. Then, a film of photosensitive resist for forming the optical elements is formed. The photosensitive resist is, for example, a positive type resist, and can be applied by spin-coating. The photosensitive resist is subjected to exposure by using a photo mask formed on the basis of the shape of the above-described optical element array, and is then developed. Thus, the optical elements are formed. A half-tone mask or an area gradation mask may be used as the photo mask. The area gradation mask is a photo mask whose transmittance is controlled by adjusting the density and area of small light-shielding elements. The optical element array may be formed by other methods. In the case where the optical elements have heights and shapes different from the design due to variations in manufacturing, the effect of suppressing the reduction in sensitivity at the periphery can be achieved when the differences are within the following range. That is, the heights of the optical elements at the periphery need to be in the range of 80% or more and 120% or less (i.e. greater than or equal to 80% and less than or equal to 120%) of those of the optical elements at the center of the image pickup region, and the radii of curvature of the outer edges of the optical elements at the periphery need to be in the range of 80% or more and 120% or less (i.e. greater than or equal to 80% and less than or equal to 120%) of those of the optical elements at the center of the image pickup region. The range for the heights may be 90% or more and 110% or less (i.e. greater than or equal to 90% and less than or equal to 110%), and the range for the radii of curvature of the outer edges may be 90% or more and 110% or less (i.e. greater than or equal to 90% and less than or equal to 110%).

In the present embodiment, the vertex of an optical element 111 is located at the center O of the array region 120 in the orthogonal projection image. However, in the orthogonal projection image, the positional relationship between the center O of the array region 120 and the optical elements is not limited to this. For example, the center O may be located between two optical elements. Alternatively, the center O may be offset from the vertex of an optical element 111.

When the shapes of the optical element arrays according to the present embodiments are measured, it can be confirmed that the optical element arrays have the following structure. That is, the vertices of the optical elements arranged in a direction away from the center of the array region have substantially the same height. Also, the vertices of the optical elements that are far from the center of the array region are closer to the center of the array region in the optical elements than the vertices of the optical elements that are close to the center of the array regions are in the optical elements. In addition, the width of the gaps between the optical elements increases as the distance from the center of the array region increases. When the optical elements have the above-described shape, the structures described in the present embodiment can be obtained.

Second Embodiment

Figure 4A:
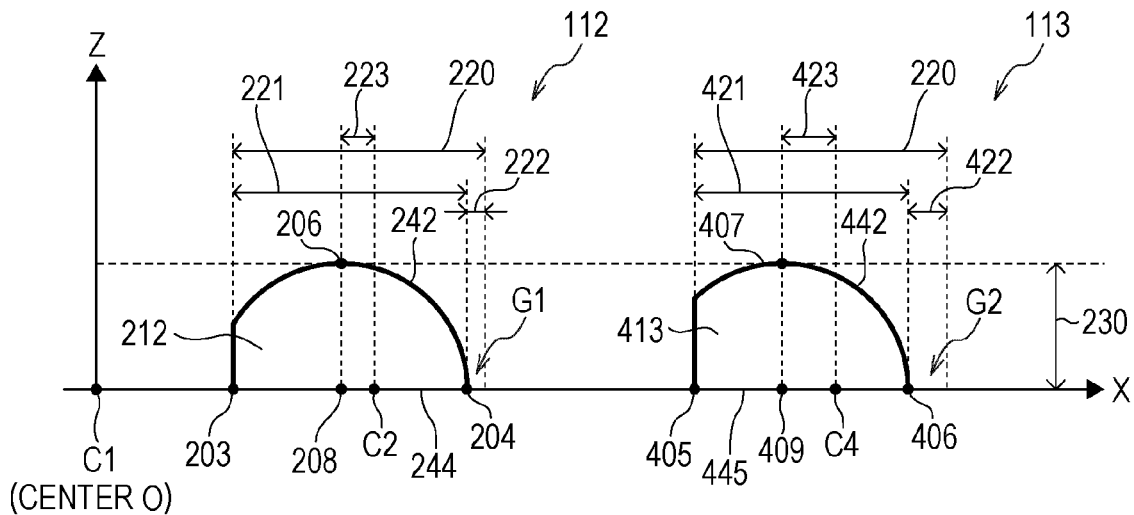
FIG. 4A is a diagram for describing the shape of an optical element array according to a second embodiment.
Figure 4B:
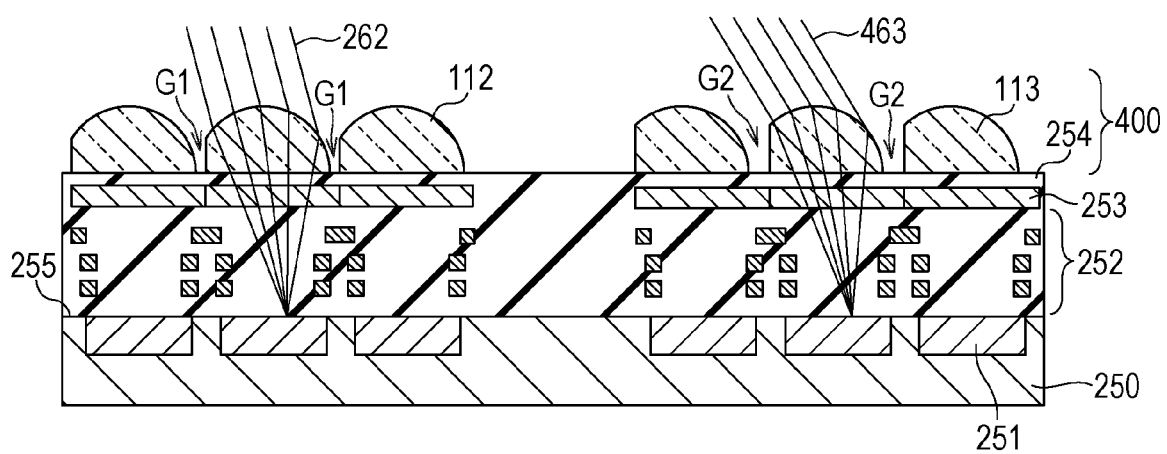
FIG. 4B is a schematic sectional view for describing the second embodiment.

An optical element array according to a second embodiment will be described with reference to FIGS. 4A and 4B. An optical element array 400 according to the present embodiment includes an optical element 113 (third optical element). FIG. 4A is a schematic diagram illustrating the cross sectional shapes of optical elements, and FIG. 4B is a schematic sectional view of a photoelectric conversion apparatus. In FIGS. 4A and 4B, an optical element 112 is the same as that in FIGS. 2A and 2B, and descriptions thereof are thus omitted.

Referring to FIG. 1, the optical element 113 illustrated in FIGS. 4A and 4B is further from the center O in the X-axis direction than the optical element 112 is, and is separated from the center O by a length 142 in the X-axis direction. The optical element 113 is shaped so as to be symmetric when a cross section 413 is set as a reference and asymmetric when the normal to a bottom surface 445 that passes through a third vertex 407 is set as a reference.

Referring to FIG. 4A, the cross section 413 of the optical element 113 includes a fifth end 405 and a sixth end 406. As shown in the cross section 413, the optical element 113 has the bottom surface 445 that extends along the X-axis at the position where Z=0. The fifth end 405 of the optical element 113 is closer to the center O, and the sixth end 406 of the optical element 113 is further from the center O. The length between the fifth end 405 and the sixth end 406 in the X-axis direction is a length 421. The length between the fifth end 405 and the sixth end 406 is the largest length of the optical element 113 in the X-axis direction.

As illustrated in FIG. 4A, the optical element 113 has the third vertex 407 at a third position 409 in the X-axis direction. The third vertex 407 is at a position separated from the bottom surface 445 by the length 230 in the Z-axis direction. In other words, the height of the optical element 113 is the same as the height of the optical element 112. The length between the third position 409 and the fifth end 405 is smaller than the length between the third position 409 and the sixth end 406. When it is assumed that the optical element 113 is provided in a unit cell that is a rectangular region having the length 220, it can be said that the third vertex 407 is closer to the center O than a center C4 of the unit cell by a length 423.

When the optical element 112 and the optical element 113 are compared with each other, in the X-axis direction, the length between the third end 203 and the second position 208 is greater than the length between the fifth end 405 and the third position 409. In other words, compared to the positional relationship between the second vertex 206 and the center of the optical element 112, the third vertex 407 is shifted further toward the center O from the center of the optical element 113. In addition, the length 421, which is the length between the fifth end 405 and the sixth end 406, is smaller than the length 220, and is also smaller than the length 221, which is the length between the third end 203 and the fourth end 204. In other words, a length 422 is smaller than the length 222.

The optical element 113 has an outer edge 442 (third outer edge) that extends from the third vertex 407 to the sixth end 406 in the cross section 413. The radius of curvature of the outer edge 442 is the same as that of the outer edge 242 of the optical element 112 in the cross section 212. Since the optical element 113 has such a shape, reduction in the light collecting performance of the optical elements can be suppressed also at a position further from the center O in the X-axis direction than the optical element 112 is. Similar to the first embodiment, also with the outer edge 242 and the outer edge 442, the median values of the radii of curvature can be determined. The effects of the present embodiment can be achieved when these values are within the range of 80% or more and 120% or less (i.e. greater than or equal to 80% and less than or equal to 120%).

A gap G2 having the length 422 is provided between the optical element 113 and an optical element that is adjacent to the optical element 113 in the X-axis direction. A gap G1, which has the length 222 smaller than the length 422, is provided between the optical element 112 and an optical element that is adjacent to the optical element 112 in the X-axis direction. Thus, the gap between the optical elements increases as the distance from the center O of the optical element array increases. The length of an interval between the optical element 111 and an optical element that is adjacent to the optical element 111 in the X-axis direction is smaller than the length 222. Alternatively, the adjacent optical elements may be in contact with each other (not shown). With the optical element array including the above-described optical elements, the reduction in light collecting performance of the optical elements can be suppressed even at positions separated from the center O. In addition, in the case where the optical element array is included in a photoelectric conversion apparatus as illustrated in FIG. 4B, the reduction in light collecting performance of the optical elements at positions separated from the center O can be further suppressed.

In FIG. 4B, the unit cells of the optical elements of the optical element array 400 are arranged such that the centers thereof coincide with the centers of the corresponding pixels of the photoelectric conversion apparatus. However, when the incident angle of light is large at the periphery of the array region 120, the unit cells of the optical elements may be shifted toward the center O of the array region 120. This will be described in detail with reference to FIG. 5.

FIG. 5 is a schematic plan view of a photoelectric conversion apparatus 500 including the optical element array 100. The photoelectric conversion apparatus 500 includes an image pickup region 520 in which a plurality of pixels 510 of the photoelectric conversion apparatus 500 are arranged. In FIG. 5, the array region 120 and the image pickup region 520 are drawn so as to overlap, and rectangular unit cells including the pixels 510 and rectangular unit cells including the respective optical elements 110 are schematically drawn so as to overlap. The center O of the array region 120 coincides with the center of the image pickup region 520. The center of each optical element 110 is shifted from the center of the corresponding pixel 510 by a certain length toward the center O. Even when light is obliquely incident on pixels near the outer periphery of the image pickup region 520 at a large incident angle, the optical elements are located on the optical paths. Therefore, the reduction in light collecting performance can be suppressed. The positions of the optical elements and the pixels may be adjusted in this manner. Another method for shifting the centers of the pixels with respect to the centers of the respective optical elements is to make the size (area) of the unit cells including the optical elements 110 smaller than the size (area) of the unit cells including the pixels 510. Another method for shifting the centers of the pixels with respect to the centers of the optical elements is to change the size of the gap illustrated in FIG. 2B.

Figure 6A:
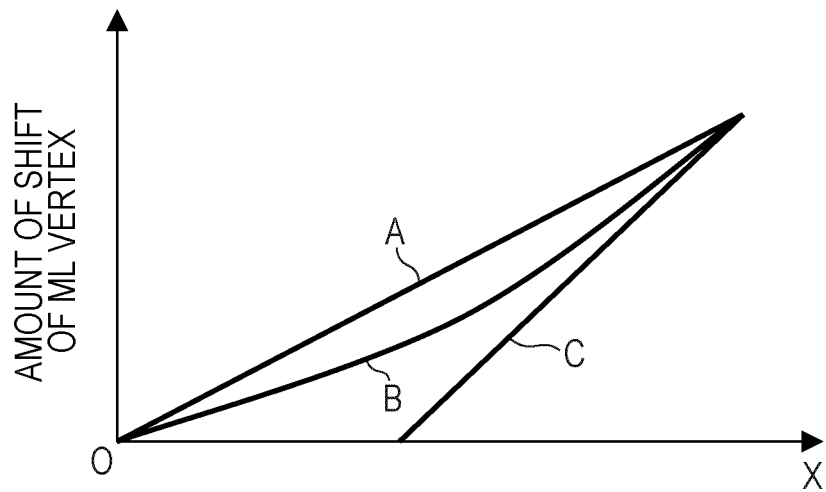
FIG. 6A is a graph for describing the second embodiment.

In the optical element array illustrated in FIG. 5, the amount of shift increases as the length from the center of the image pickup region increases. The amount of shift will be described with reference to FIG. 6A. In FIG. 6A, the horizontal axis represents the length from the center of the image pickup region in a direction from the center of the image pickup region toward the outside of the image pickup region, and the vertical axis represents the amount of shift of the vertex of each optical element. FIG. 6A shows three examples of the manner in which the amount of shift is changed. Line A shows an example in which the amount of shift increases in direct proportion to the length from the center of the image pickup region. Line B shows an example in which the amount of shift increases non-linearly along a parabola with respect to the length from the center of the image pickup region. Line C shows an example in which the amount of shift starts to increase from a position that is separated from the center of the image pickup region by a certain length. Thus, the amount of shift can be changed in any way. The amount of shift can be determined on the basis of, for example, design data such as the opening ratio of the photoelectric conversion apparatus, the height from the photoelectric conversion elements to the optical elements, the refractive index of each material, and the incident angle of light.

Figure 6B:
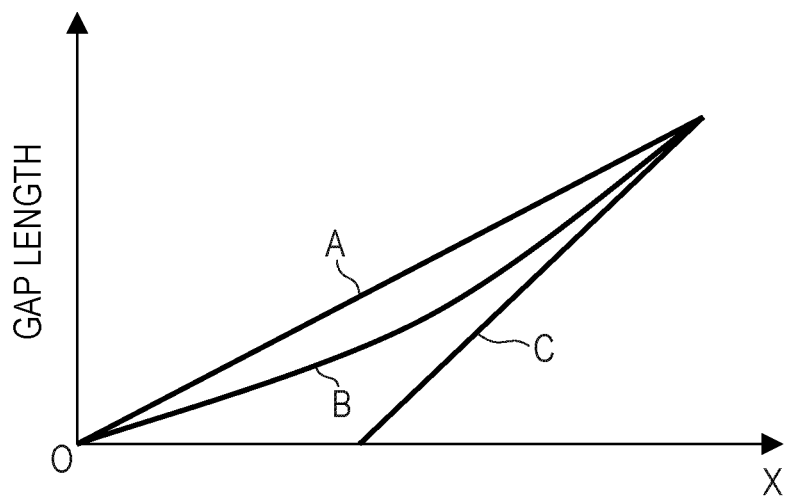
FIG. 6B is a graph for describing the second embodiment.

As illustrated in FIG. 2B, to maintain the radius of curvature of the outer edge of each optical element at the periphery of the image pickup region, a gap, which is a flat region, is provided between each optical element 112 and an optical element adjacent thereto. The length of the gaps will be described with reference to FIG. 6B. In FIG. 6B, the horizontal axis represents the length from the center of the image pickup region in a direction from the center of the image pickup region toward the outside of the image pickup region, and the vertical axis represents the gap length. FIG. 6B shows three examples of the manner in which the gap length is changed. Line A shows an example in which the gap length increases in direct proportion to the length from the center of the image pickup region. Line B shows an example in which the gap length increases non-linearly along a parabola with respect to the length from the center of the image pickup region. Line C shows an example in which the gap length starts to increase from a position that is separated from the center of the image pickup region by a certain length. Similar to the amount of shift, the gap length can be changed in any way. In the case where the amount of shift is changed along Line B, the gap length may also be changed along Line B to facilitate the design of the radius of curvature of the outer edge of each optical element.

In the present embodiment, the optical element 111, the optical element 112, and the optical element 113 illustrated in FIG. 1 are described as first, second, and third optical elements, respectively. However, the above-described relationships of the amount of shift of the vertex and the gap length also apply to, for example, three optical elements including the optical element 112, the optical element 113, and an optical element 114 illustrated in FIG. 1. As illustrated in FIG. 1, the optical element 114 is further away from the center O in the X-axis direction than the optical element 113 is, and has the height 230, similar to the optical element 112 and the optical element 113. In this case, the amount of shift of the vertex and the gap length of the optical element 114 may be designed so as to satisfy the above-described relationships.

In the optical element array, the number of each of the first to third optical elements may, for example, be one. Alternatively, different numbers of first to third optical elements may be provided. Thus, any numbers of first to third optical elements may be provided. For example, each of the first to third optical elements may be provided in a plurality in the optical element array. In this case, the optical element array may include a first region in which the first optical elements are arranged, a second region in which the second optical elements are arranged, and a third region in which the third optical elements are arranged.

Third Embodiment

Figure 7A:
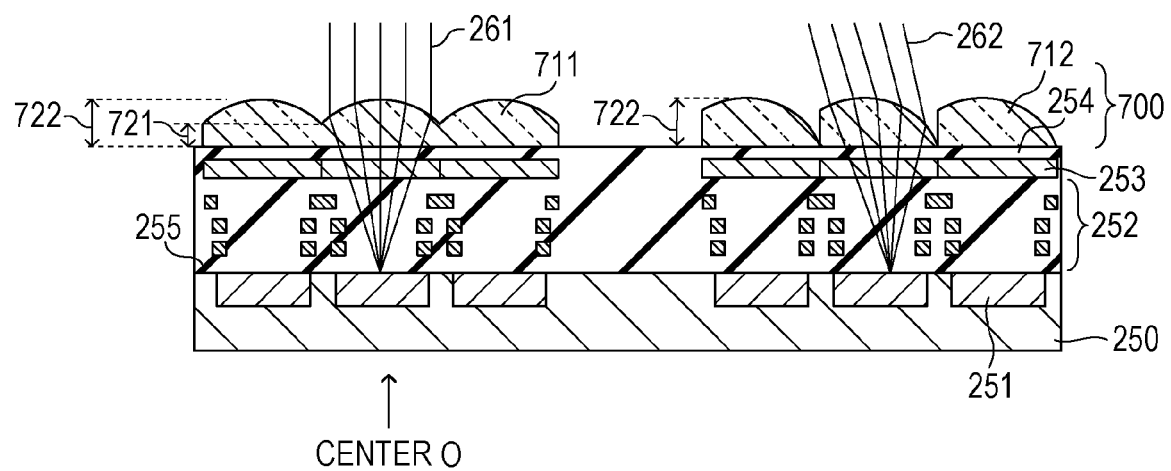
FIG. 7A is a schematic sectional view for describing a third embodiment.
Figure 7B:
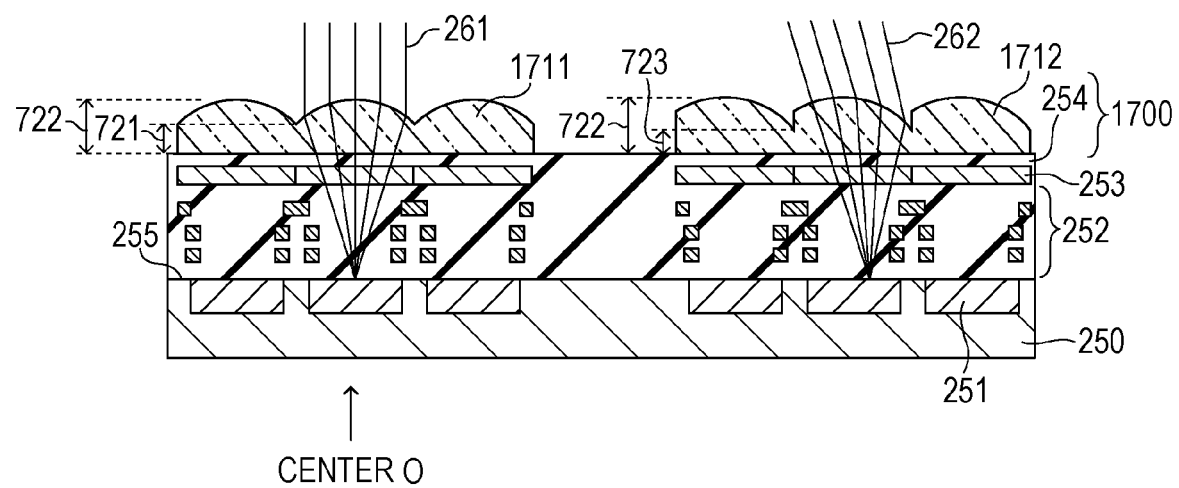
FIG. 7B is a schematic sectional view for describing the third embodiment.

FIGS. 7A and 7B are schematic sectional views illustrating photoelectric conversion apparatuses according to a third embodiment. FIG. 7A is a schematic sectional view that corresponds to FIG. 2B. An optical element array 700 includes optical elements 711 and optical elements 712. The optical elements 711 differ from the optical elements 111 illustrated in FIG. 2B in that the boundaries between the adjacent optical elements are higher than those between the optical elements 111 by a height 721, and the optical elements 711 are shaped such that a member having the height 721 and the optical elements 111 are combined together. The optical elements 712 differ from the optical elements 112 illustrated in FIG. 2B in that there are no gaps between the adjacent optical elements. Similar to FIG. 2B, the height of the optical elements 711 and the height of the optical elements 712 are both equal to a length 722. Similar to FIG. 2B, the vertices of the optical elements 712 are shifted further toward the center of the image pickup region than the vertices of the optical elements 711 are in the respective unit cells. Also when the optical elements 711 and 712 have the above-described shapes, the height of the optical elements 711 can be made the same as the height of the optical elements 712 and the radius of curvature of the outer edge between the vertex and an end of each optical element 711 can be made the same as the radius of curvature of the outer edge between the vertex and an end of each optical element 712. In this optical element array, since there are no gaps in a region corresponding to the periphery of the image pickup region, compared to the first embodiment, the amount of incident light that can be collected can be increased at the periphery of the image pickup region. As a result, the reduction in sensitivity at the periphery of the image pickup region can be further suppressed.

The shape of the optical element array is not limited to this, and the optical element array may instead have a shape illustrated in FIG. 7B. FIG. 7B is a schematic sectional view that corresponds to FIG. 7A. An optical element array 1700 includes optical elements 1711 and optical elements 1712. The optical elements 1711 are the same as the optical elements 711 illustrated in FIG. 7A. The optical elements 1712 differ from the optical elements 712 illustrated in FIG. 7A in that the boundaries between the adjacent optical elements are higher than those between the optical elements 712 by a height 723. Similar to FIG. 7A, the vertices of the optical elements 1712 are shifted further toward the center of the image pickup region than the vertices of the optical elements 1711 are in the respective unit cells. Also when the optical elements 1711 and 1712 have the above-described shapes, the height of the optical elements 1711 can be made the same as the height of the optical elements 1712 and the radius of curvature of the outer edge between the vertex and an end of each optical element 1711 can be made the same as the radius of curvature of the outer edge between the vertex and an end of each optical element 1712.

Fourth Embodiment

Figure 8A:
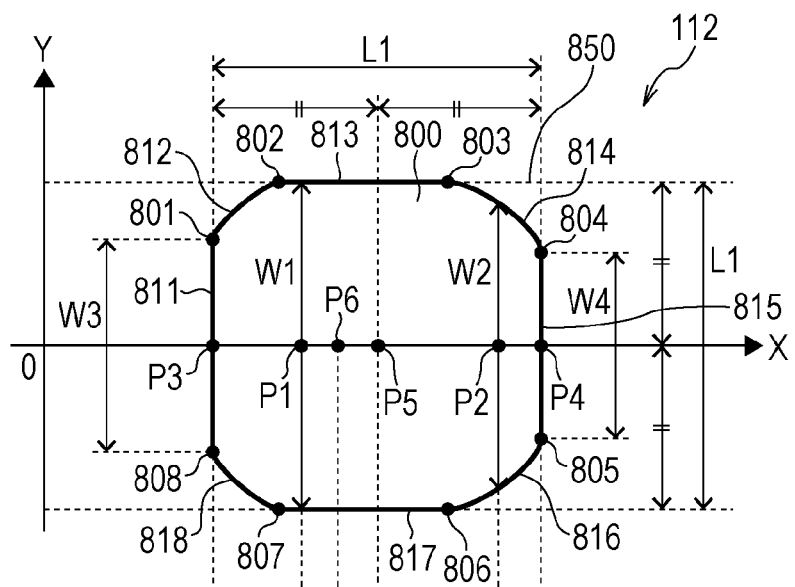
FIG. 8A is a diagram for describing the shape of an optical element array according to a fourth embodiment.
Figure 8B:
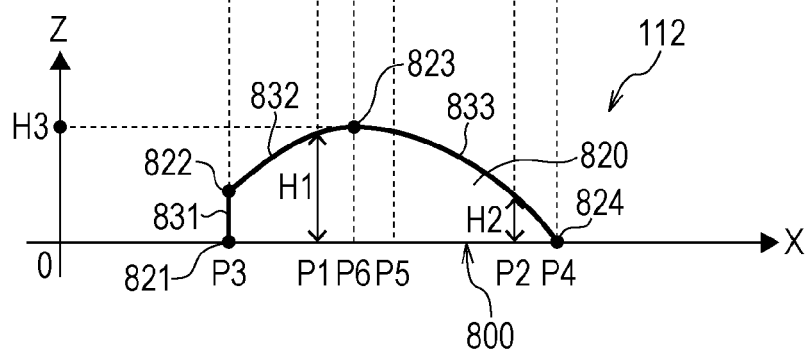
FIG. 8B is a diagram for describing the shape of the optical element array according to the fourth embodiment.
Figure 8C:
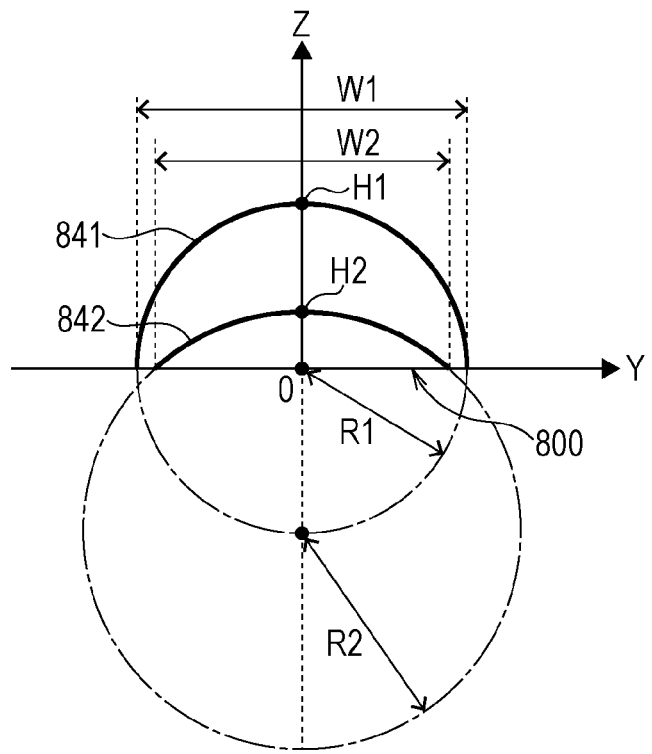
FIG. 8C is a diagram for describing the shape of the optical element array according to the fourth embodiment.

In a fourth embodiment, an example of the shape of an optical element 112 according to other embodiments will be described. FIG. 8A is a schematic diagram illustrating the planar shape of the optical element 112. FIGS. 8B and 8C are schematic diagrams illustrating the cross sectional shapes of the optical element 112.

FIG. 8A is a schematic plan view illustrating a bottom surface 800 of the optical element 112 on a plane that extends in the X-axis direction and the Y-axis direction. The bottom surface 800 has the same shape as an image (orthogonal projection image) obtained by projecting the optical element 112 onto the plane that extends in the X-axis direction and the Y-axis direction. As is clear from the bottom surface 800, the optical element 112 has a length L1 in both the X-axis direction and the Y-axis direction. The bottom surface 800 (optical element) includes positions P1 to P6 arranged in the X-axis direction. The positions P3, P1, P6, P5, P2, and P4 are arranged in that order from the position closest to the center O.

In the bottom surface 800 of the optical element 112, an outer edge 811 of a region 850, the outer edge 811 being closest to the center O and extending in the Y-axis direction, is disposed at the position P3. In addition, in the bottom surface 800 of the optical element 112, an outer edge 815 of the region 850, the outer edge 815 being farthest from the center O and extending in the Y-axis direction, is disposed at the position P4. The center of the bottom surface 800 of the optical element 112 is disposed at the position P5, which is at the middle point between the position P3 and the position P4. In other words, the position P4 is separated from the position P3 by the length L1, and the position P5 is separated from the position P3 by half the length L1 (L1/2). The position P6 is the position of the vertex of the optical element 112 in the X-axis direction, as described below. The region 850 corresponds to a unit cell described in other embodiments, and corresponds to a single cell of a two-dimensional grid arranged in the array region 120. A single optical element is disposed in each cell.

As illustrated in FIG. 8A, the bottom surface 800 is horizontally line symmetric about the X-axis, and includes outer edges 811 to 818. The outer edge 811 is a straight line connecting a point 801 and a point 808. The outer edge 812 is a curve connecting the point 801 and a point 802. The outer edge 813 is a straight line connecting the point 802 and a point 803. The outer edge 814 is a curve connecting the point 803 and a point 804. The outer edge 815 is a straight line connecting the point 804 and a point 805. The outer edge 816 is a curve connecting the point 805 and a point 806. The outer edge 817 is a straight line connecting the point 806 and a point 807. The outer edge 818 is a curve connecting the point 807 and the point 808. The outer edges 811 and 815 are straight lines that extend in the Y-axis direction. The outer edges 813 and 817 are straight lines that extend in the X-axis direction. The outer edges 812, 814, 816, and 818 have curvatures, and connect the straight lines.

The bottom surface 800 has a width W1 (first width) in the Y-axis direction at the position P1 (fourth position) in the X-axis direction. The bottom surface 800 has a width W2 (second width) in the Y-axis direction at the position P2 (fifth position) in the X-axis direction. In addition, the bottom surface 800 has widths W3 and W4 in the Y-axis direction at the positions P3 and P4, respectively. These widths satisfy at least W1>W2. Furthermore, W1>W2 >W3>W4 may be satisfied. In FIG. 8A, W1=L1 is satisfied.

The position P1 is any position that is separated from the position P3 by a length that is less than or equal to half the length L1, and the position P2 is any position that is separated from the position P3 by a length that is greater than half the length L1. In other words, the position P1 is any position that is closer to the position P3 than the position separated from the position P3 by half the length L1, and the position P2 is any position that is further from the position separated from the position P3 by half the length L1. The positions P1 and P2 are arranged such that the distance between the position P2 and the center O is greater than the distance between the position P1 and the center O.

FIG. 8B is a schematic diagram illustrating the cross sectional shape of the optical element 112 along the X-axis in FIG. 8A. A cross section 820 of the optical element 112 along the plane that extends in the Z-axis direction and the X-axis direction includes outer edges 831 to 833. The outer edge 831 is a straight line that connects a point 821 and a point 822. The outer edge 832 is a curve that connects the point 822 and a point 823. The outer edge 833 is a curve that connects the point 823 and a point 824. The optical element 112 has a height H1 (first height) at the position P1, a height H2 (second height) at the position P2, and a height H3 at the position P6. The heights satisfy H3>H1>H2. Here, the height H3 is the largest height of the optical element 112. In other words, the point 823 at the position P6 is the vertex of the optical element 112. The vertex of the optical element 112 is at the position P6, which is closer to the center O than the position P5. Here, the vertex means the highest portion of the cross section. In the present embodiment, the optical element 112 has the vertex point. However, it is not necessary that the highest portion be a point, and the portion between the position P1 and the position P5 may, for example, have the height H3.

As illustrated in FIG. 8B, in the optical element 112, the outer edge 832 includes a portion having a radius of curvature that is smaller than that of the outer edge 833. The outer edge 832 may also include a portion having a radius of curvature that is greater than that of the outer edge 833. The radius of curvature, or the median value of the radius of curvature, of the outer edge 833 is the same as that of the outer edge 241 of the optical element 111. With this structure, high lens power can be achieved and the light incident on the outer edge 833 can be collected with higher light collecting performance compared to that in the structure of the related art. The radius of curvature can be determined from a tangent line at any point on the cross section of an optical element. For example, a tangent line of the outer edge 833 at the middle point of the outer edge 833 in the X-axis direction (middle point between the positions P6 and P4) is determined. The radius of curvature can be determined from an inscribed circle that is in contact with the tangent line. The radius of curvature of each portion can be determined by other general methods for measuring the radius of curvature. Alternatively, similar to other embodiments, the median value of the radius of curvature of each outer edge can be determined.

FIG. 8C is a schematic diagram illustrating the cross sectional shapes of the optical element 112 at the position P1 and the position P2 in FIG. 8A. A cross section 841 is a cross section of the optical element 112 taken along the Y-axis direction at the position P1 in FIG. 8A. A cross section 842 is a cross section of the optical element 112 taken along the Y-axis direction at the position P2 in FIG. 8A. In the cross section 841, the optical element 112 has a width W1 and a first height H1, which is the largest height of the cross section 841, at the vertex of the cross section 841. The outer edge of the cross section 841 has a radius of curvature R1 (first radius of curvature). In the cross section 842, the optical element 112 has a width W2 and a height H2, which is the largest height of the cross section 842, at the vertex of the cross section 842. Although the cross sections of the optical element 112 have the vertex points in the present embodiment, as described above, it is not necessary that portions at which the optical element 112 have the heights H1 and H2 be points. The outer edge of the cross section 842 has a radius of curvature R2 (second radius of curvature). The radii of curvature satisfies R1<R2. Although R1≥R2 may be satisfied, the width W2 will be reduced in such a case. Accordingly, there is a possibility that the area occupancy will be reduced. In such a case, the width W2 of the optical element may form an outer edge in FIG. 8A. When the outer edge having the width W2 is provided at the position farthest from the center O, the area occupancy can be increased and light can be received over a broader range.

As illustrated in FIGS. 8A to 8C, the optical element 112 has the width W1, the height H1, and the radius of curvature R1 at the position P1, and has the width W2, the height H2, and the radius of curvature R2 at the position P2. When W1>W2, H1>H2, and R1<R2 are satisfied, the optical element 112 provides higher light collecting performance and higher area occupancy compared to those in the structure of the related art, and the light collection efficiency can be increased.

The optical elements of each embodiment can be formed by, for example, photolithography. In this case, desired optical elements can be obtained by subjecting photoresist to exposure in an exposure device by using an area gradation mask or a gray tone mask having a transmittance determined from the design data of the shape of the optical elements, and then performing development. In addition, heat treatment for deforming the shape of the photoresist can be additionally performed. An optical element array according to any of the above-described embodiments manufactured by the above-described method may have a shape that differs from the shape defined by the design data due to diffraction of light in the exposure process or the influence of the heat treatment.

Figure 9:
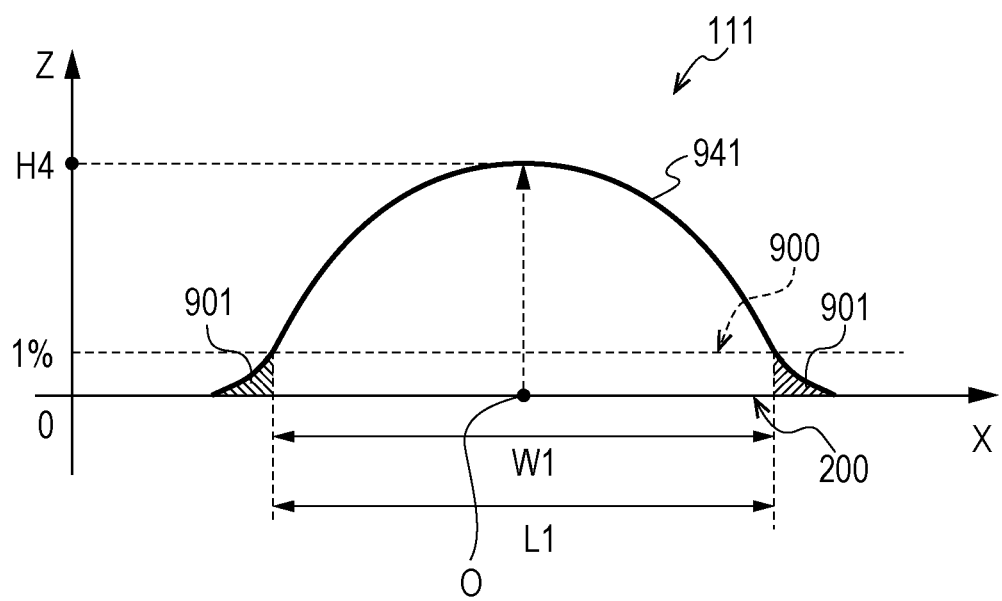
FIG. 9 is a diagram for describing the shape of an optical element according to any of the embodiments.

The shape of an optical element array according to any of the embodiments that has been manufactured will be described with reference to FIG. 9. FIG. 9 is a diagram illustrating a shape 941 that corresponds to the shape of the cross section 211 of the optical element 111 illustrated in FIG. 2A. In FIG. 9, components that are the same as those in FIG. 2A are denoted by the same reference numerals, and explanations thereof are thus omitted. The manufactured optical element 111 may include extending portions 901 which are in contact with a bottom surface 200 and spread from the bottom surface 200. The spreading of the portions that are in contact with the bottom surface 200 may occur in any of the optical elements in any region. When the widths and gaps are actually measured, a plane 900 that is parallel to the bottom surface 200 may be set at a position where the height is 1% of the largest height H4 of any optical element 111, and the shape of each optical element on the plane 900 may be measured. Also when the adjacent optical elements are in contact with each other and it is difficult to determine the shapes of thereof, distances, etc., on the plane 900 may be measured.

Examples of methods for measuring the shapes include a method of measuring the surface of the optical element array with an AFM or the like and a method for measuring a cross section of the optical element array with an SEM or the like.

The above-described embodiments may be applied to an image pickup system, such as a camera. The concept of the image pickup system is not limited to an apparatus which is used mainly to perform a shooting operation, and also includes an apparatus having a shooting function as an auxiliary function (for example, a personal computer or a mobile device). The image pickup system includes a photoelectric conversion apparatus according to any of the above-described embodiments of the present invention, and a signal processing unit for processing signals output from the photoelectric conversion apparatus. This signal processing unit includes, for example, an A/D converter and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-212298 filed Oct. 9, 2013, which is hereby incorporated by reference herein in its entirety.

What is claimed is:

1. An optical element array comprising:
a plurality of optical elements including at least a first optical element and a second optical element located on a same plane,
wherein the first optical element is located at a center of an array region, which is a region on the same plane in which the optical elements are arranged,
the second optical element is further from the center of the array region than the first optical element,
an orthogonal projection of the first optical element on the plane includes a first end and a second end located closer to the second optical element than the first end and located on a first straight line that passes through the first end and the center of the array region,
an orthogonal projection of a vertex of the first optical element on the plane is equally spaced from the first end and the second end and located at a first position on the first straight line,
an orthogonal projection of the second optical element on the plane includes a third end that is located on the first straight line and a fourth end that is located on the first straight line and that is further from the center of the array region than the third end is,
an orthogonal projection of a vertex of the second optical element on the plane is located at a second position on the first straight line,
an interval between the third end and the second position is smaller than an interval between the first end and the first position, and is also smaller than an interval between the fourth end and the second position,
in a cross section of the first optical element, the cross section being perpendicular to the plane and including the first straight line, the first optical element includes a first outer edge that extends from the vertex of the first optical element to the second end,
in a cross section of the second optical element, the cross section being perpendicular to the plane and including the first straight line, the second optical element includes a second outer edge that extends from the vertex of the second optical element to the fourth end, and
a radius of curvature of the second outer edge or a median value of the radius of curvature of the second outer edge is greater than or equal to 80% and less than or equal to 120% of a radius of curvature of the first outer edge or a median value of the radius of curvature of the first outer edge.

2. The optical element array according to claim 1, wherein an interval between the third end and the fourth end is smaller than an interval between the first end and the second end.

3. The optical element array according to claim 1, wherein the second optical element has a shape that is symmetric about the cross section.

4. The optical element array according to claim 1, wherein the optical elements further comprise a third optical element located further from the center of the array region than the second optical element along the first straight line,
- an orthogonal projection of the third optical element on the plane includes a fifth end that is located on the first straight line and a sixth end that is located on the first straight line and that is further from the center of the array region than the fifth end is,
- an orthogonal projection of a vertex of the third optical element on the plane is located at a third position on the first straight line,
- an interval between the fifth end and the third position is smaller than the interval between the third end and the second position,
- in a cross section of the third optical element, the cross section being perpendicular to the plane and including the first straight line, the third optical element includes a third outer edge that extends from the vertex of the third optical element to the sixth end, and
- a radius of curvature of the third outer edge or a median value of the radius of curvature of the third outer edge is greater than or equal to 80% and less than or equal to 120% of the radius of curvature of the second outer edge or greater than or equal to 80% and less than or equal to 120% of the median value of the radius of curvature of the second outer edge.

5. The optical element array according to claim 4, wherein the optical elements further comprise a fourth optical element adjacent to the first optical element along the first straight line, a fifth optical element adjacent to the second optical element along the first straight line, and a sixth optical element adjacent to the third optical element along the first straight line,
- wherein an interval between the second optical element and the fifth optical element is greater than an interval between the first optical element and the fourth optical element, and
- an interval between the third optical element and the sixth optical element is greater than the interval between the second optical element and the fifth optical element.

6. The optical element array according to claim 4, wherein an interval between the fifth end and the sixth end is smaller than an interval between the third end and the fourth end.

7. The optical element array according to claim 1, wherein the optical element array includes a first region in which a plurality of first optical elements are arranged and a second region in which a plurality of second optical elements are arranged.

8. The optical element array according to claim 1, wherein the orthogonal projection of the second optical element on the plane has a first width along a second straight line at a fourth position located on the first straight line in the second optical element, the second straight line being located on the plane and perpendicular to the first straight line, and a second width along the second straight line at a fifth position on the first straight line in the second optical element, the fifth position being located further away from the center of the array region than the fourth position is, the second width being smaller than the first width,
- in a first cross section of the second optical element, the first cross section being perpendicular to the plane and including the first width, the second optical element has a first radius of curvature and a first largest height,
- in a second cross section of the second optical element, the second cross section being perpendicular to the plane and including the second width, the second optical element has a second radius of curvature and a second largest height, and
- the second radius of curvature is greater than the first radius of curvature, and the second largest height is smaller than the first largest height.

9. The optical element array according to claim 1, wherein the orthogonal projection of the second optical element on the plane has a first width along a second straight line at a fourth position located on the first straight line in the second optical element, the second straight line being located on the plane and perpendicular to the first straight line, and a second width along the second straight line at a fifth position on the first straight line in the second optical element, the fifth position being located further away from the center of the array region than the fourth position is, the second width being smaller than the first width,
- in a first cross section of the second optical element, the first cross section being perpendicular to the plane and including the first width, the second optical element has a first largest height,
- in a second cross section of the second optical element, the second cross section being perpendicular to the plane and including the second width, the second optical element has a second largest height, and
- the second height is smaller than the first height, and the fifth position is located on an outer edge of the orthogonal projection of the second optical element on the plane.

10. A photoelectric conversion apparatus comprising:
- the optical element array according to claim 1; and
- a semiconductor substrate including a first photoelectric conversion element that is provided so as to correspond to the first optical element and a second photoelectric conversion element that is provided so as to correspond to the second optical element.

11. The photoelectric conversion apparatus according to claim 10,
- wherein the first photoelectric conversion element forms a first pixel and the second photoelectric conversion element forms a second pixel,
- orthogonal projections of the first pixel and the second pixel on the plane include rectangular regions having respective centers,
- the orthogonal projections of the first optical element and the second optical element have respective centers, and
- in the orthogonal projections of the first pixel, the second pixel, the first optical element, and the second optical element on the plane, the center of the second optical element and the center of the rectangular region of the second pixel are arranged along the first straight line, and the center of the second optical element is displaced from the center of the rectangular region of the second pixel toward the center of the array region by a first length.

12. An image pickup system comprising:
- the photoelectric conversion apparatus according to claim 10; and
- a signal processing unit that processes a signal from the photoelectric conversion apparatus.

13. An optical element array comprising:
a plurality of optical elements including at least a first optical element and a second optical element located on a same plane,
wherein the second optical element is further from a center of an array region, which is a region on the same plane in which the optical elements are arranged, than the first optical element,
an orthogonal projection of the first optical element on the plane includes a first end and a second end located further from the center of the array region than the first end is and located on a first straight line that passes through the first end and the center of the array region,
an orthogonal projection of a vertex of the first optical element on the plane is located at a first position on the first straight line,
an orthogonal projection of the second optical element on the plane includes a third end that is located on the first straight line and a fourth end that is located on the first straight line and that is further from the center of the array region than the third end is,
an orthogonal projection of a vertex of the second optical element on the plane is located at a second position on the first straight line,
an interval between the third end and the second position is smaller than an interval between the first end and the first position, and is also smaller than an interval between the fourth end and the second position,
in a cross section of the first optical element, the cross section being perpendicular to the plane and including the first straight line, the first optical element includes a first outer edge that extends from the vertex of the first optical element to the second end,
in a cross section of the second optical element, the cross section being perpendicular to the plane and including the first straight line, the second optical element includes a second outer edge that extends from the vertex of the second optical element to the fourth end, and
a radius of curvature of the second outer edge or a median value of the radius of curvature of the second outer edge is greater than or equal to 80% and less than or equal to 120% of a radius of curvature of the first outer edge or greater than or equal to 80% and less than or equal to 120% of a median value of the radius of curvature of the first outer edge.

14. The optical element array according to claim 13, wherein an interval between the third end and the fourth end is smaller than an interval between the first end and the second end.

15. The optical element array according to claim 13, wherein the second optical element has a shape that is symmetric about the cross section.

16. The optical element array according to claim 13, wherein the optical elements further comprise a third optical element located further from the center of the array region than the second optical element along the first straight line,
an orthogonal projection of the third optical element on the plane includes a fifth end that is located on the first straight line and a sixth end that is located on the first straight line and that is further from the center of the array region than the fifth end is,
an orthogonal projection of a vertex of the third optical element on the plane is located at a third position on the first straight line,
an interval between the fifth end and the third position is smaller than the interval between the third end and the second position,
in a cross section of the third optical element, the cross section being perpendicular to the plane and including the first straight line, the third optical element includes a third outer edge that extends from the vertex of the third optical element to the sixth end, and
a radius of curvature of the third outer edge or a median value of the radius of curvature of the third outer edge is greater than or equal to 80% and less than or equal to 120% of the radius of curvature of the second outer edge or greater than or equal to 80% and less than or equal to 120% of the median value of the radius of curvature of the second outer edge.

17. The optical element array according to claim 16, wherein the optical elements further comprise a fourth optical element adjacent to the first optical element along the first straight line, a fifth optical element adjacent to the second optical element along the first straight line, and a sixth optical element adjacent to the third optical element along the first straight line,
wherein an interval between the second optical element and the fifth optical element is greater than an interval between the first optical element and the fourth optical element, and
an interval between the third optical element and the sixth optical element is greater than the interval between the second optical element and the fifth optical element.

18. The optical element array according to claim 16, wherein an interval between the fifth end and the sixth end is smaller than an interval between the third end and the fourth end.

19. A photoelectric conversion apparatus comprising:
the optical element array according to claim 13; and
a semiconductor substrate including a first photoelectric conversion element that is provided so as to correspond to the first optical element and a second photoelectric conversion element that is provided so as to correspond to the second optical element.

20. An image pickup system comprising:
the photoelectric conversion apparatus according to claim 13; and
a signal processing unit that processes a signal from the photoelectric conversion apparatus.

* * * * *